(12) United States Patent
Kim et al.

(10) Patent No.: US 9,584,132 B2
(45) Date of Patent: Feb. 28, 2017

(54) CLOCK GENERATOR WITH STABILITY DURING PVT VARIATIONS AND ON-CHIP OSCILLATOR HAVING THE SAME

(71) Applicants: Sung-Jin Kim, Ulsan (KR); Jihyun Kim, Hwaseong-si (KR); Taeik Kim, Seongnam-si (KR)

(72) Inventors: Sung-Jin Kim, Ulsan (KR); Jihyun Kim, Hwaseong-si (KR); Taeik Kim, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/961,523

(22) Filed: Dec. 7, 2015

(65) Prior Publication Data

US 2016/0211852 A1    Jul. 21, 2016

(30) Foreign Application Priority Data

Jan. 20, 2015    (KR) .................. 10-2015-0009355

(51) Int. Cl.
*H03L 1/02* (2006.01)
*G06F 1/04* (2006.01)
*H03B 5/24* (2006.01)
*H03L 7/06* (2006.01)

(52) U.S. Cl.
CPC ............ *H03L 1/02* (2013.01); *G06F 1/04* (2013.01); *H03B 5/24* (2013.01); *H03L 7/06* (2013.01)

(58) Field of Classification Search
CPC ....... H03K 3/0231; H03K 3/354; H03K 3/011
See application file for complete search history.

(56) References Cited

U.S. PATENT DOCUMENTS

| 5,317,287 A | 5/1994 | Brown |
| 6,060,957 A * | 5/2000 | Kodrnja ............. H03K 3/0231 331/143 |
| 8,860,517 B2 * | 10/2014 | Giacomini .................... 331/111 |
| 2014/0035690 A1 | 2/2014 | Lee |
| 2014/0176250 A1 | 6/2014 | Thomsen et al. |

FOREIGN PATENT DOCUMENTS

| JP | 2001044759 A | 2/2001 |
| JP | 5573781 | 7/2014 |
| KR | 100289816 | 2/2001 |

OTHER PUBLICATIONS

"Process-Independent Resistor Temperature-Coefficients using Series/Parallel and Parallel/Series Composite Resistors" published on Circuits and Systems, 2007. ISCAS 2007. IEEE International Symposium O N, IEEE, PI, May 1, 2007 (May 1, 2007), pp. 2826-2829.

* cited by examiner

*Primary Examiner* — Jeffrey Shin
(74) *Attorney, Agent, or Firm* — Volentine & Whitt, PLLC

(57) ABSTRACT

Provided is a clock generator that includes a comparator in which characteristics of two input signals vary over time. A voltage controller, having a resistor and at least one constant current source, generates a direct current (DC) voltage proportional to an output current of the constant current source and a resistance value of the resistor. The comparator compares a ramp voltage generated by the voltage controller with the DC voltage.

20 Claims, 9 Drawing Sheets

CLOCK GENERATOR WITH STABILITY DURING PVT VARIATIONS AND ON-CHIP OSCILLATOR HAVING THE SAME

CROSS-REFERENCE TO RELATED APPLICATION

This application claims priority under 35 U.S.C. §119 to Korean Patent Application No. 10-2015-0009355 filed on Jan. 20, 2015, the disclosure of which is hereby incorporated by reference in its entirety.

BACKGROUND

Field

Example embodiments relate to a clock generator. More specifically, example embodiments further relate to a clock generator insensitive to process variation and operating with high-performance, and an on-chip oscillator including the same.

Description of Related Art

There has been a trend to commercialize flat panel display devices equipped with touch screen panels.

In general, a mobile device which activates a main CPU of an application processor with predetermined period to perform processing of data received from at least one sensor module.

The mobile device uses a clock signal for data processing operation. The main CPU of the application processor operates by receiving the clock signal having a predetermined period from an external clock source, such as a phase locked loop (PLL) coupled to an off-chip oscillator. Accordingly, considering a normal operation speed and performance required for such a data processing operation, excessive power may be consumed since the external clock source is used.

Accordingly, demand for on-chip oscillators has been recently increasing.

SUMMARY

Example embodiments of the disclosure provide a clock generator insensitive to process, voltage, and temperature (PVT) variations and providing a high-resolution operation, and an on-chip oscillator including the same.

The technical objectives of the disclosure are not limited to the above disclosure; other objectives may become apparent to those of ordinary skill in the art based on the following descriptions.

In accordance with an aspect of the disclosure, a clock generator includes a comparator in which characteristics of two input signals vary over time and a voltage controller including a resistor and at least one constant current source. The voltage controller generates a direct current (DC) voltage proportional to an output current of the constant current source and a resistance value of the resistor. The comparator compares a ramp voltage generated by the voltage controller with the DC voltage.

In some embodiments, the voltage controller includes a first capacitor and a second capacitor and the resistor may be coupled between the first capacitor and the second capacitor.

In other embodiments, the second capacitor may be discharged while the first capacitor is charged and the second capacitor may be charged while the first capacitor is discharged.

In still other embodiments, the ramp voltage comprises a voltage charged in the first capacitor and a voltage charged in the second capacitor.

In still other embodiments, input nodes of the comparator may alternately receive the DC voltage and the voltages charged in the first capacitor and the second capacitor over time.

In accordance with another aspect of the disclosure, a clock generator includes a voltage generator configured to supply a bias voltage and a voltage controller including a constant current source, a resistor, and a capacitance. The voltage controller generates a ramp voltage between the constant current source and the capacitance and a DC voltage between the constant current source and the resistor, based upon the bias voltage. A comparator generates a clock signal by comparing the ramp voltage with the DC voltage.

In some embodiments, the voltage generator may include a metal-oxide semiconductor field-effect-transistor (MOSFET).

In other embodiments, the voltage generator may include a plurality of switches controlled by the clock signal, a first capacitor and a second capacitor, each having the capacitance, which are charged and discharged reverse to each other according to settings of some of the switches, and a resistor coupled between the first capacitor and the second capacitor.

In still other embodiments, the voltage controller may form a current path from the constant current source to the resistor according to the clock signal to generate the DC voltage.

In still other embodiment, the second capacitor may be discharged while the first capacitor is charged according to the clock signal.

In still other embodiments, the comparator may compare the DC voltage with the voltage charged in the first capacitor.

In still other embodiments, the second capacitor may be charged while the first capacitor is discharged according to the clock signal.

In still other embodiment, the comparator may compare the DC voltage with the ramp voltage charged in the second capacitor.

In still other embodiments, capacitances of the first capacitor and the second capacitor may be substantially the same.

In still other embodiments, input nodes of the comparator may alternately receive the DC voltage and the ramp voltage over time.

In accordance with still another aspect of the disclosure, an on-chip oscillator includes a first periodic signal generator including a resistor and a capacitor and configured to supply a first periodic signal. A second periodic signal generator is configured to supply a second periodic signal having a constant period over time. A counter is configured to count the number of clocks of the first periodic signal while the second periodic signal is supplied and output the count. A comparator is configured to compare an output count of the counter and a preset frequency. An accumulator is configured to accumulate results of the comparator. A calibrator is configured to perform addition or subtraction on the number of clocks of the first periodic signal, depending on a result of the accumulator.

In some embodiments, the first periodic signal generator may include at least one constant current source. The first periodic signal generator may generate a ramp voltage between the constant current source and the capacitor and a DC voltage between the constant current source and the resistor by using charging and discharging operations of the capacitor, and generate the first periodic signal by comparing the ramp voltage and the DC voltage.

In other embodiments, the second periodic signal generator may include a voltage generator configured to generate a bias voltage, a voltage controller controlled by the bias voltage to generate a charging or discharging voltage, and a comparator configured to compare the charging or discharging voltage of the voltage controller and a reference voltage.

In still other embodiments, the voltage controller may include a plurality of switches, a first capacitor and a second capacitor, which are charged and discharged reverse to each other according to settings of some of the switches, and a plurality of resistors coupled between the first capacitor and the second capacitor.

In still other embodiment, the plurality of resistors may be coupled to have a resistance ratio.

In still other embodiments, a discharging level of one of the first and second capacitors may be controlled by the resistance ratio.

In still other embodiments, the reference voltage and one selected from the charged voltages of the first and second capacitors may be input to the comparator.

In still other embodiments, the plurality of switches may be controlled by an enable signal, and output signals of the comparator may be controlled to be output twice while the enable signal is activated once.

In still other embodiments, a difference in output timings between the signals output twice from the comparator may be the second periodic signal.

In still other embodiments, each of the output signals generated twice from the comparator may include a delay time, and the delay times may be compensated as common mode components in the constant periodic signal.

In accordance with still another aspect of the disclosure, a clock generator includes a first voltage source that: (1) generates a first ramp voltage, during a first portion of a clock cycle, by conveying an amount of current through a first capacitor and (2) generates a constant voltage during a second portion of the clock cycle by conveying the amount of current through a resistance. A second voltage source: (1) generates the constant voltage during the first portion of the clock cycle by conveying the amount of current through the resistance and (2) generates a second ramp voltage, during the second portion of the clock cycle, by conveying the amount of current through a second capacitor. A comparator generates a clock signal having the clock cycle by comparing: (1) the first ramp voltage generated by the first voltage source and the constant voltage generated by the second voltage source during the first portion of the clock cycle and (2) the constant voltage generated by the first voltage source and the second ramp voltage generated by the second voltage source during the second portion of the clock cycle. The first and second portions of the clock cycle are non-overlapping periods.

In still other embodiments, the clock generator includes first and second current sources that each generates a constant current of the amount of current and first, second, third, and fourth switches. The first switch provides a first current path between the first current source and the first capacitor during the first portion of the clock cycle and does not provide the first current path between the first current source and the first capacitor during the second portion of the clock cycle. The second switch provides a second current path between the first current source and the resistance during the second portion of the clock cycle and does not provide the second current path between the first current source and the resistance during the first portion of the clock cycle. The third switch provides a third current path between the second current source and the resistance during the first portion of the clock cycle and does not provide the third current path between the second current source and the resistance during the second portion of the clock cycle. The fourth switch provides a fourth current path between the second current source and the second capacitor during the second portion of the clock cycle and does not provide the fourth current path between the second current source and the second capacitor during the first portion of the clock cycle.

In accordance with still another aspect of the disclosure, a clock generator includes a first voltage source that generates a first ramp voltage, during a first portion of a clock cycle, by conveying an amount of current through a first capacitor. A second voltage source generates a second ramp voltage, during a second portion of the clock cycle, by conveying the amount of current through a second capacitor. A third voltage source generates a constant voltage, during both the first and second portions of the clock cycle, by conveying the amount of current through a resistance. A comparator generates a clock signal having the clock cycle by comparing: (1) the first ramp voltage generated by the first voltage source and the constant voltage generated by the third voltage source during the first portion of the clock cycle and (2) the second ramp voltage generated by the second voltage source and the constant voltage generated by the third voltage source during the second portion of the clock cycle. The first and second portions of the clock cycle are non-overlapping periods.

In still other embodiments, the clock generator includes a switch that conveys the first ramp voltage to an input of the comparator during the first portion of the clock cycle and conveys the second ramp voltage to the input of the comparator during the second portion of the clock cycle.

BRIEF DESCRIPTION OF THE DRAWINGS

The foregoing and other features and advantages of the disclosure will be apparent from the more particular description of preferred embodiments of the disclosure, as illustrated in the accompanying drawings in which like reference numerals denote the same respective parts throughout the different views. The drawings are not necessarily to scale, emphasis instead being placed upon illustrating the principles of the disclosure. In the drawings.

DETAILED DESCRIPTION OF THE EMBODIMENTS

Figure 1:
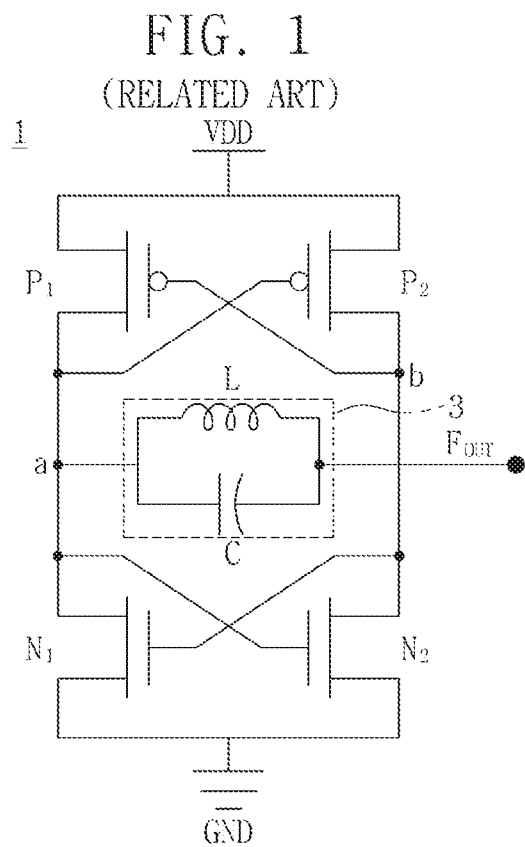
FIG. 1 is a circuit diagram illustrating an example of a clock generator of a normal on-chip oscillator.

Various embodiments of the disclosure are described more fully with reference to the accompanying drawings in which some embodiments are shown. The embodiments of the disclosure are provided for complete disclosure and to fully show the scope of the disclosure to those skilled in the art, and only defined by the scope of the appended claims. In descriptions of the disclosure, when it is determined that detailed explanations of related well-known functions or configurations unnecessarily obscure the gist of the disclosure, the detailed description thereof will not be repeated. The same reference numerals denote the same elements throughout the specification. Accordingly, the same numerals and similar numerals can be described with reference to other drawings, even if not specifically described in a corresponding drawing.

In the embodiments of the present disclosure disclosed herein, specific structural and functional details are merely representative for purposes of describing example embodiments of the present disclosure, and thus example embodiments of the present disclosure may be embodied in many alternate forms and should not be construed as limited to example embodiments of the present disclosure set forth herein.

While the disclosure is susceptible to various modifications and alternative forms, specific embodiments thereof are shown by way of example in the drawings and will herein be described in detail. It should be understood, however, that there is no intent to limit the disclosure to the particular forms disclosed, but on the contrary, the disclosure is to cover all modifications, equivalents, and alternatives falling within the spirit and scope of the disclosure.

It will be understood that, although the terms "first," "second," etc. may be used herein to describe various elements, these elements should not be limited by these terms. These terms are only used to distinguish one element from another. Therefore, a first element, a first component, or a first section could be termed a second element, a second component, or a second section within the scope of the disclosure.

It will be understood that when an element is referred to as being "coupled to" or "coupled to" another element, it can be coupled or coupled to the other element or intervening elements may be present. In contrast, when an element is referred to as "directly coupled to" or "directly coupled to" another element or layer, there are no intervening elements or layers present. Other words used to describe the relationship between elements, for example, "between" versus "directly between", "adjacent" versus "directly adjacent", etc. should be interpreted in a like fashion.

The terminology used herein to describe embodiments of the disclosure is not intended to limit the scope of the disclosure. The use of the singular form in the present document should not preclude the presence of more than one referent. In other words, elements of the disclosure referred to in the singular may number one or more, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It should also be noted that in some alternative implementations, the functions/operations noted in the blocks may occur out of the order noted in the flowcharts. For example, two blocks shown in succession may in fact be executed substantially concurrently or the blocks may sometimes be executed in the reverse order, depending upon the functionality/operations involved.

Hereinafter, various embodiments of the disclosure will be described more fully with reference to the accompanying drawings.

FIG. 1 is a circuit diagram illustrating an example of a clock generator in a normal on-chip oscillator.

In contemporary on-chip oscillators, which have been implemented in order to overcome the large amount of power consumption in the existing off-chip oscillators (e.g. a phase-locked loop (PLL)) based on an external clock source.

Referring to FIG. 1, a clock generator 1 may employ, for example, an LC-type oscillator.

The clock generator 1 may include first and second PMOS transistors P1 and P2, first and second NMOS transistors N1 and N2, and a resonator 3 consisting of an inductor L and a capacitor C.

A gate of the first PMOS transistor P1 may be electrically coupled to a node b, a source of the first PMOS transistor P1 may be electrically coupled to voltage VDD, and a drain of the first PMOS transistor P1 may be electrically coupled to a node a.

A gate of the second PMOS transistor P2 may be electrically coupled to the node a, a source of the second PMOS transistor P2 may be electrically coupled to the voltage VDD, and a drain of the second PMOS transistor P2 may be electrically coupled to the node b.

A gate of the first NMOS transistor N1 may be electrically coupled to the node b, a source of the first NMOS transistor N1 may be electrically coupled to a ground voltage GND, and a drain of the first NMOS transistor N1 may be electrically coupled to the node a.

A gate of the second NMOS transistor N2 may be electrically coupled to the node a, a source of the second NMOS transistor N2 may be electrically coupled to the ground voltage GND, and a drain of the second NMOS transistor N2 may be electrically coupled to the node b.

The resonator 3 may include the inductor L and the capacitor C coupled in parallel. The inductor L and the capacitor C may be an electromagnetic energy storage device. A specific frequency may be selectively passed by coupling the inductor L and the capacitor C in parallel, and a resonance may be generated depending on characteristics of the inductor L and the capacitor C.

A transition of a signal of the node a is determined in accordance with resonance characteristics of the resonator 3.

Meanwhile, the first PMOS transistor P1 and the first NMOS transistor N1 may be controlled by a signal of the node b, and the second PMOS transistor P2 and the second NMOS transistor N2 may be controlled by a signal of the node a.

The transistors P1, P2, N1, and N2 may be complementarily coupled and controlled such that a pair of transistors are operated during a half period of a signal and the other pair of transistors are operated during the other half period of the signal.

In other words, the transistors P1, P2, N1, and N2 may consist of cross-coupled inverter pairs. For example, when the signal of the node a is at a low level, the second PMOS transistor P2 may be turned on and the node b may be at a high level, and thus the first NMOS transistor N1 may be turned on. Accordingly, the signal of the node a may be maintained at the low level.

On the other hand, when the signal of the node a is at a high level, the second NMOS transistor N2 may be turned on and the node b may be at a low level, and thus the first PMOS transistor P1 may be turned on. Accordingly, the signal of the node a may be maintained at the high level.

Accordingly, accurate output frequencies $F_{OUT}$ in accordance with periods of transition signals generated in the resonator 3 may be generated.

However, since the clock generator 1 includes the inductor L, an area thereof may be relatively enlarged. In addition, fine tuning of frequencies may be difficult.

Figure 2:
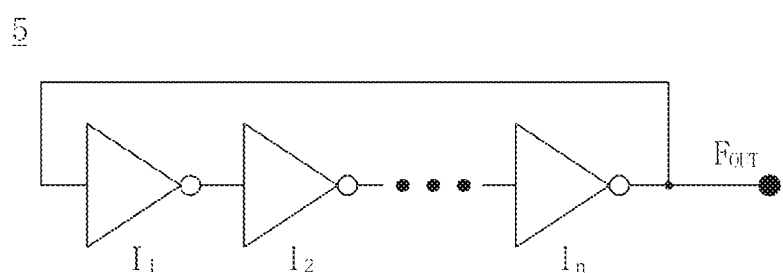
FIG. 2 is a circuit diagram illustrating another example of a clock generator of a normal on-chip oscillator.

FIG. 2 is a circuit diagram illustrating another example of a clock generator in an on-chip oscillator.

Referring to FIG. 2, a clock generator 5 may include a plurality of inverters $I_1$ to $I_n$.

The clock generator 5 illustrated in FIG. 2 is a general ring-type oscillator, wherein a period of a clock may be determined according to the amount of delay of the delay devices, that is, the inverters $I_1$ to $I_n$.

The clock generator 5 illustrated in FIG. 2 may have high area efficiency since it occupies a smaller area than the LC-type clock generator 1 illustrated in FIG. 1, but may have a large frequency error since the amount of delay or a delay time of each of the delay devices has process, voltage, and temperature (PVT) variations.

Figure 3A:
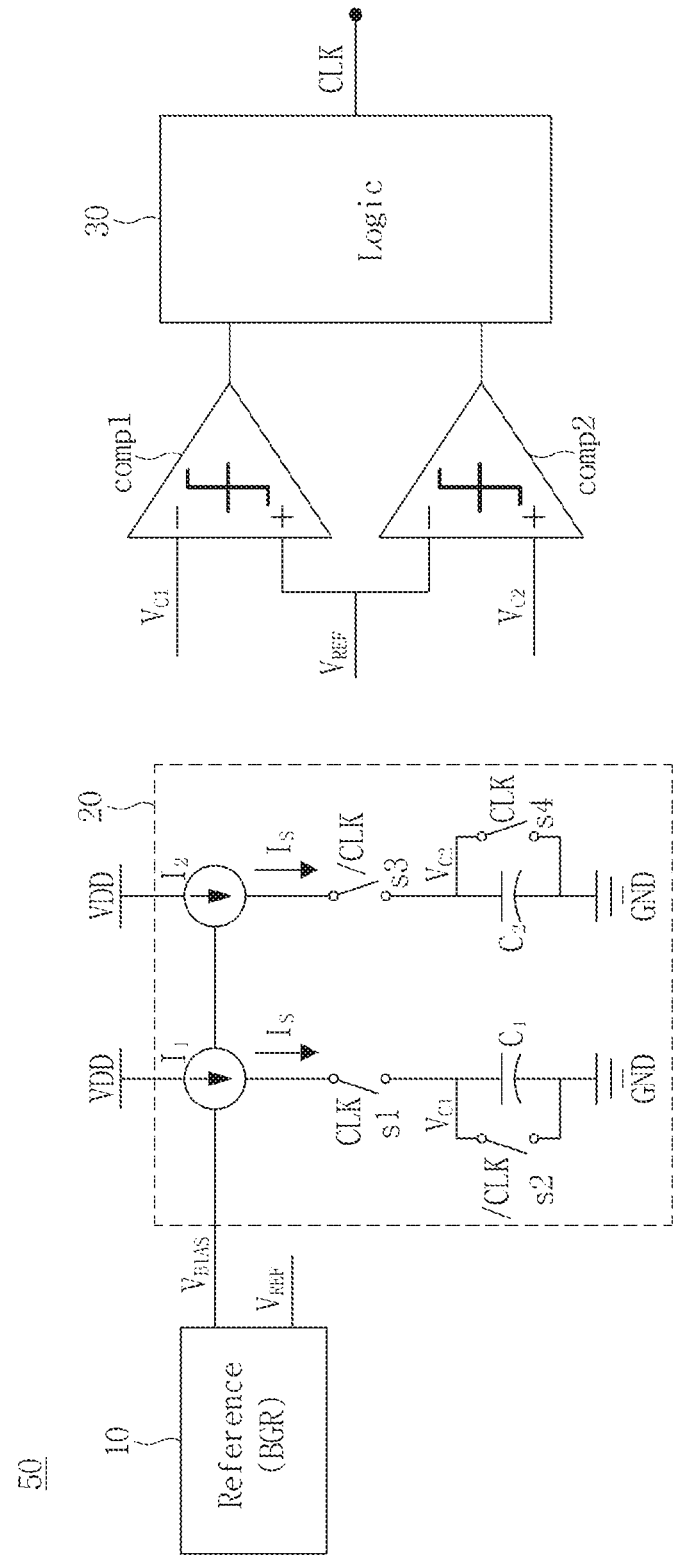
FIG. 3A is a circuit diagram illustrating still another example of a clock generator of a normal on-chip oscillator.

A clock generator occupying a smaller area than the LC-type clock generator and having a smaller frequency error, due to the PVT variations, than the ring-type clock generator is exemplarily described in FIG. 3A.

FIG. 3A is a circuit diagram illustrating still another example of a clock generator of an on-chip oscillator.

In FIG. 3A, a circuit diagram of a relaxation clock generator 50 is illustrated.

Referring to FIG. 3A, the relaxation clock generator 50 may include a bias voltage generator 10, a voltage controller 20, first and second comparators comp1 and comp2, and a logic part 30.

The bias voltage generator 10 may adopt a circuit of a bandgap reference (BGR) voltage generator. Such a bias voltage generator 10 may generate a constant bias voltage $V_{BIAS}$ and a constant reference voltage $V_{REF}$. The bias voltage $V_{BIAS}$ may be supplied to constant current sources I1 and I2. Thus, the constant current sources I1 and I2 may supply constant currents. The reference voltage $V_{REF}$ may be supplied to the first and second comparators comp1 and comp2.

The voltage controller 20 may include a plurality of switches s1, s2, s3, and s4, and first and second capacitors C1 and $C_2$.

First, the first constant current source I1 and the first capacitor C1 may have a serial structure to be selectively coupled to each other through the first switch s1.

Accordingly, a voltage applied to a current path from the first constant current source I1 may charge the first capacitor C1.

Likewise, the second constant current source I2 and the second capacitor $C_2$ may have a serial structure to be selectively coupled to each other through the third switch s3.

Accordingly, a voltage applied to a current path from the second constant current source I2 may charge the second capacitor $C_2$.

In addition, the switches s2 and s4 may be respectively coupled to the capacitors C1 and $C_2$ in parallel.

The first and second comparators comp1 and comp2 may respectively compare a charging voltage $V_{C1}$ of the first capacitor C1 and a charging voltage $V_{C2}$ of the second capacitor $C_2$, based on the common reference voltage $V_{REF}$.

The logic part 30 may determine the logic (a low level or a high level) of a result of each comparison to provide it in the form of a clock CLK.

Meanwhile, the clock CLK may be appropriately applied as an inverted or non-inverted signal to the plurality of switches s1, s2, s3, and s4.

Figure 3B:
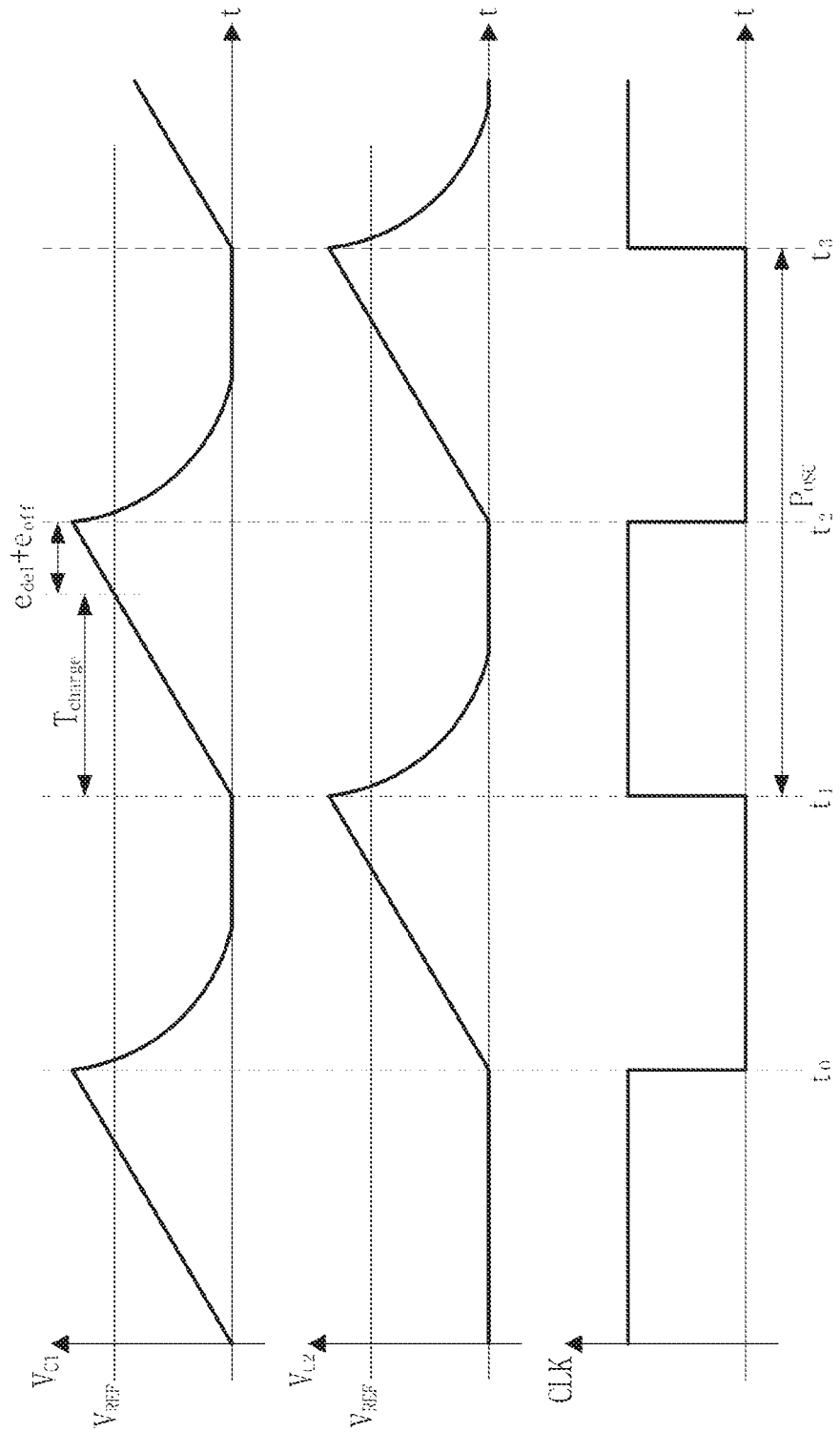
FIG. 3B is an operational timing diagram according to FIG. 3A.

FIG. 3B is an operational timing diagram according to FIG. 3A.

An operation of the relaxation clock generator 50 is described with reference to FIGS. 3A and 3B. When a constant current $I_S$ is applied to the capacitors C1 and $C_2$, it can be seen voltages $V_{C1}$ and $V_{C2}$ of the capacitors C1 and $C_2$ are linearly increased.

First, when the first switch s1 is coupled until time t0, the first capacitor C1 may be charged with a voltage linearly increasing by the constant current $I_S$, that is, the first charging voltage $V_{C1}$.

The first comparator comp1 may compare the reference voltage $V_{REF}$ with the first charging voltage $V_{C1}$.

Meanwhile, when the third switch s3 is not coupled until the time t0, the second capacitor $C_2$ may be discharged to zero (a ground level).

At a time t0 to t1, the first capacitor C1 may be discharged, and the second capacitor $C_2$ may be charged with the second charging voltage $V_{C2}$ by the constant current $I_S$.

A charging time $T_{charge}$, which is the time for the first charging voltage $V_{C1}$ to reach a predetermined reference voltage $V_{REF}$, may be expressed as the following Equation 1.

$$T_{charge} = \frac{C_1 V_{REF}}{I_S} \qquad \text{[Equation 1]}$$

(where $C_1$ is a capacitance of the first capacitor C1, $V_{REF}$ is a reference voltage, and Is is a constant current).

The time at which the first charging voltage $V_{C1}$ becomes the same as the reference voltage $V_{REF}$ may be detected through the first comparator comp1, and a clock CLK having a constant frequency may be generated in synchronization with a timing at which an output of the first comparator comp1 is inverted.

However, as shown in FIG. 3B, the clock CLK may be generated a predetermined time ($e_{del}+e_{off}$) later than the timing at which the output result of the first comparator comp1 is inverted.

This may be caused by a delay time $e_{del}$ of the first comparator comp1 itself with respect to an operation time and an offset error $e_{off}$ due to an input offset of the first comparator comp1.

Assuming that a capacitance $C_1$ of the first capacitor C1 and a capacitance $C_2$ of the second capacitor C2 are the same ($C_1=C_2=C_0$), an output period $P_{OSC}$ of the relaxation clock generator 50 may be expressed as the following Equation 2.

$$P_{OSC} = T_{charge1} + T_{charge2} + \text{error} \quad \text{[Equation 2]}$$
$$= 2\frac{C_0 V_{REF}}{I_S} + e_{del1} + e_{off1} + e_{del2} + e_{off2}$$
$$\approx 2\left(\frac{C_0 V_{REF}}{I_S} + e_{del} + e_{off}\right)$$

(where $e_{del1}$ is a delay time of the first comparator comp1, $e_{off1}$ is an input offset error of the first comparator comp1, $e_{del2}$ is a delay time of the second comparator comp2, and $e_{off2}$ is an input offset error of the second comparator comp2).

Since the relaxation clock generator 50 uses two comparators, deviations in delay time and input offset error between the two comparators may occur. Thus, such a delay time and input offset error are variable elements that may be changed according to PVT variations.

Although a relaxation clock generator is less sensitive to PVT variations than a ring-type clock generator, it may still have variable elements due to PVT variations, in particular, voltage and temperature variations.

In order for the relaxation clock generator to be insensitive to the voltage and temperature variations, delay time of a comparator needs to be small. For this, the comparator may have large power consumption.

In addition, in order to reduce the input offset error due to random mismatches between transistors configuring the comparator, the transistors configuring the comparator should have increased sizes.

Further, it is obvious that a relaxation clock generator including a circuit of a high-performance bandgap voltage generator to supply a constant bias voltage to constant current sources Is1 and Is2 occupies a considerable area. Although the relaxation clock generator has better area efficiency than the inductor-type clock generator, area load elements may not be excluded since a considerable area for adopting the circuit of the bandgap voltage generator is required. Further, the bandgap voltage generating circuit may use a bipolar junction transistor (BJT) that is operated at a higher power voltage level than a normal MOS-type transistor. For example, while a power voltage level of MOS-type transistors is 0.8 V, the power voltage level of the BJT may be 1.8 V. Accordingly, it is difficult to achieve low power operation. Further, since an additional masking process needs to be introduced in order to form the BJT, manufacturing costs may increase.

Figure 4A:
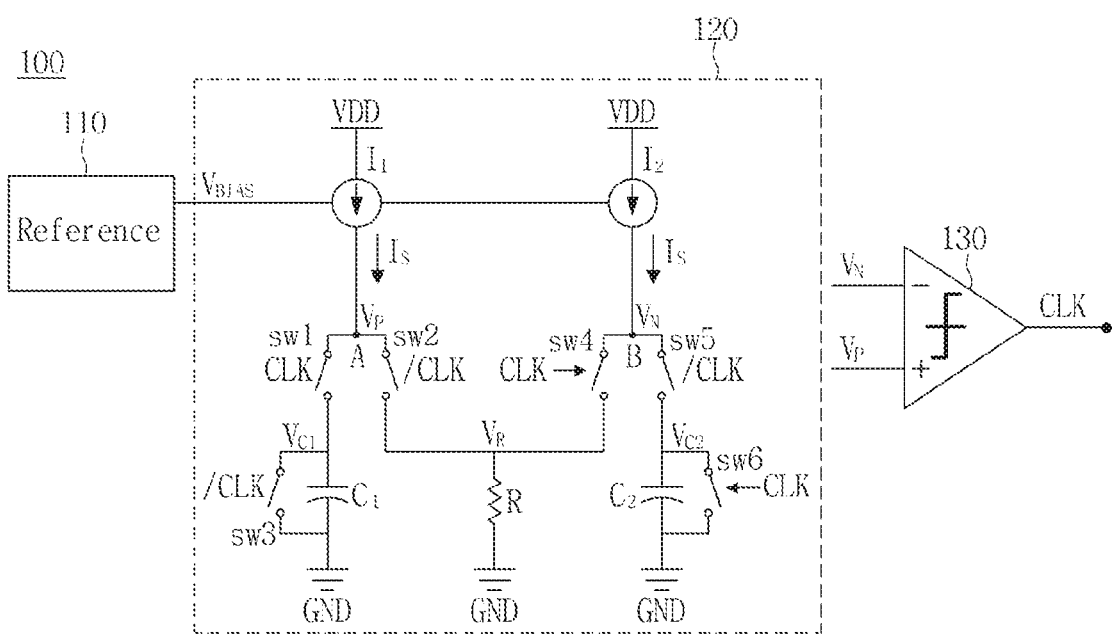
FIG. 4A is a circuit diagram illustrating a clock generator in accordance with an embodiment of the disclosure.

FIG. 4A is a circuit diagram of a clock generator 100 in accordance with an embodiment of the disclosure.

Referring to FIG. 4A, the clock generator 100 may include a bias voltage generator 110, a voltage controller 120, and a comparator 130.

The clock generator 100 in accordance with the embodiment of the disclosure may operate at low power, and perform self-error compensation for supply voltage and temperature variations.

The bias voltage generator 110 may supply a constant bias voltage $V_{BIAS}$.

Here, the bias voltage generator 110 may not necessarily be a high-performance reference circuit.

The voltage controller 120 may include a first constant current source I1, a second constant current source I2, a plurality of switches sw1, sw2, sw3, sw4, sw5, and sw6, first and second capacitors C1 and C2, and a resistor R.

The first switch sw1 may be configured to form a current path from the first constant current source I1 to the first capacitor C1. In addition, the third switch sw3 may be disposed between both ends of the first capacitor C1 to form a discharging path as needed.

The fifth switch sw5 may be configured to form a current path from the second constant current source I2 to the second capacitor C2. In addition, the sixth switch sw6 may be disposed between both ends of the second capacitor C2 to form a discharging path as needed.

Meanwhile, the resistor R may be disposed in parallel between the current path from the first constant current source I1 to the first capacitor C1 and the current path from the second constant current source I2 to the second capacitor C2. Thus, the second switch sw2 may be disposed to form a current path from the first constant current source I1 to the resistor R, and the fourth switch sw4 may be disposed to form a current path from the second constant current source I2 to the resistor R.

The first switch sw1, the fourth switch sw4, and the sixth switch sw6 may receive a positive signal of a clock CLK, and the second switch sw2, the third switch sw3, and the fifth switch sw5 may receive a negative signal of the clock CLK.

The comparator 130 may compare a voltage $V_P$ of a node A of the voltage controller 120 with a voltage $V_N$ of a node B of the voltage controller 120 to supply the clock CLK. The comparator 130 may receive two voltages having varying input characteristics through input nodes thereof over time without an additional node for receiving a reference voltage. That is, the comparator 130 may be controlled to cross-receive a DC voltage and a ramp-up voltage over time through input nodes thereof.

More specifically, when a constant current $I_S$ of the first constant current source I1 is applied to the first capacitor C1 to generate a linearly increasing voltage, that is, a first charging voltage $V_{C1}$, the constant current $I_S$ of the second constant current source I2 may flow to the resistor R through the fourth switch sw4 to generate a reference voltage $V_R$ in a node of the resistor R.

That is, according to the embodiment of the disclosure, a reference voltage $V_R$ may be generated at the same time while the charging voltage is generated in one of the capacitors C1 and C2. That is, a linearly increasing voltage and a constant DC voltage may be simultaneously formed.

The comparator 130 may compare the voltage $V_P$ of the node A, that is, the first charging voltage $V_{C1}$ with the voltage $V_N$ of the node B, that is, the reference voltage $V_R$.

More specifically, when the clock CLK is initially at a high level, the voltage $V_P$ of the node A may be the first charging voltage $V_{C1}$, and the voltage $V_N$ of the node B may be the reference voltage $V_R$.

Accordingly, the first charging voltage $V_{C1}$ may be applied to a first input node VP(+) of the comparator 130, and the reference voltage $V_R$ may be applied to a second input node VN(−) of the comparator 130. When the first charging voltage $V_{C1}$ reaches the reference voltage $V_R$ as time elapses, an output of the comparator 130 may be transitioned from a high level to a low level.

At the same time, since a current path from the second constant current source I2 to the second capacitor C2 is formed, the voltage $V_N$ of the node B may become a second charging voltage $V_{C2}$, and since the constant current $I_S$ of the first constant current source I1 flows to the resistor R through the second switch sw2, the voltage $V_P$ of the node A may become the reference voltage $V_R$. Accordingly, changes in voltage may occur in the input nodes VP(+) and VN(−) of the comparator 130. That is, the second charging voltage $V_{C2}$ may be applied to the second input node VN(−) of the comparator 130, and the reference voltage $V_R$ may be applied to the first input node VP(+) of the comparator 130.

The first capacitor C1 may be discharged to a ground level since a discharging path is formed, and an output of the comparator 130 may transition from a low level to a high level when the second charging voltage $V_{C2}$ reaches the reference voltage $V_{REF}$.

According to the embodiment of the disclosure, a ramp-up voltage or a constant DC voltage may be applied to the first input node VP(+) of the comparator 130. Likewise, the constant DC voltage or the ramp-up voltage may be applied to the second input node VN(−) of the comparator 130.

By repeating such a process, a clock CLK having a constant period may be generated.

Figure 4B:
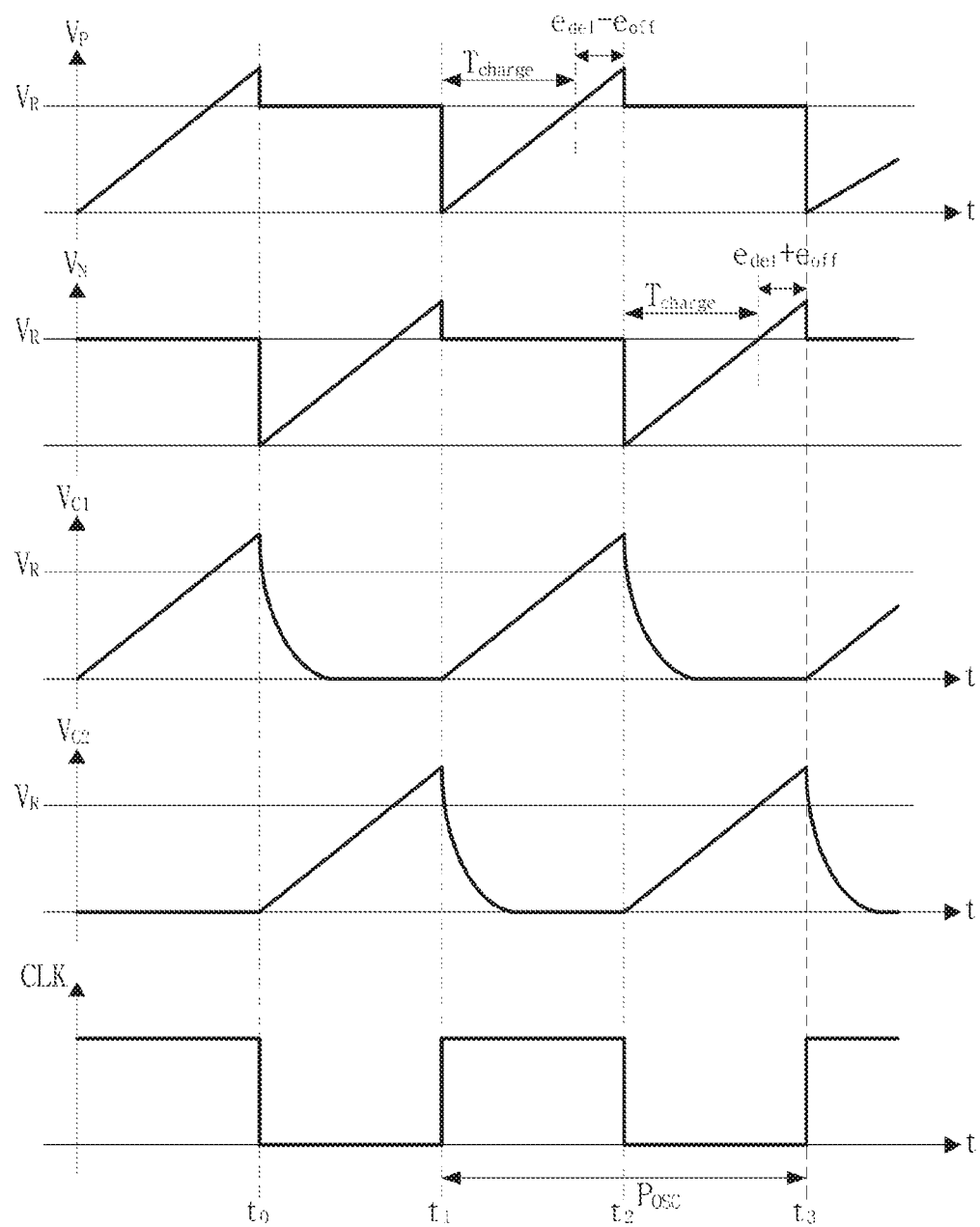
FIG. 4B is an operational timing diagram according to FIG. 4A.

FIG. 4B is an operational timing diagram according to FIG. 4A.

Referring to FIGS. 4A and 4B, until time t0, the reference voltage $V_R$ may maintain a constant voltage level generated by the resistor R as a passive device.

First, until the time t0, when the clock CLK is at a high level, the first charging voltage $V_{C1}$ may linearly increase. By detecting a moment at which the first charging voltage $V_{C1}$ becomes higher than the reference voltage $V_R$, the comparator 130 may output a result of comparison. When the clock CLK is initially at the high level, the voltage $V_P$ of the node A may become the first charging voltage $V_{C1}$, and the voltage $V_N$ of the node B may become the reference voltage $V_R$. As time elapses, when the first charging voltage $V_{C1}$ reaches the reference voltage $V_R$, the output of the comparator 130 may transition from the high level to the low level.

During time period t0 to t1, the first capacitor $C_1$ may be discharged, and the second charging voltage $V_{C2}$ may linearly increase. By detecting a moment at which the second charging voltage $V_{C2}$ becomes higher than the reference voltage $V_R$, the comparator 130 may output a result of comparison. Accordingly, the second charging voltage $V_{C2}$ may be applied to the second input node VN(−) of the comparator 130, and the reference voltage $V_R$ may be applied to the first input node VP(+) of the comparator 130.

Next, during time period t1 to t2, the first charging voltage $V_{C1}$ may linearly increase again. By detecting a moment at which the first charging voltage $V_{C1}$ becomes higher than the reference voltage $V_R$, the comparator 130 may output a result of comparison.

Thus, the amount of time in time period t1 to t3 may be defined as an output period $P_{OSC}$ of the clock generator 100.

In FIG. 4B, the charging time $T_{charge}$ and additional delay elements $e_{del}$ and $e_{off}$ are illustrated.

Here, $C_1$ represents a capacitance of the first capacitor C1, and $C_2$ represents a capacitance of the second capacitor C2. Assuming that $C_1$ and $C_2$ have substantially the same value $C_0$, a periodic signal in accordance with the embodiment of the disclosure may be expressed as the following Equation 3.

$$P_{OSC} = \left(\frac{C_0 V_R}{I_S} + e_{del} + e_{off}\right) + \left(\frac{C_0 V_R}{I_S} + e_{del} - e_{off}\right) \quad \text{[Equation 3]}$$
$$= 2\left(\frac{C_0 I_S R}{I_S} + e_{del}\right) = 2(RC_0 + e_{del})$$

That is, since the clock generator 100 has one comparator 130 and characteristics of the input node thereof are changed every period of the clock CLK, input offset characteristics of the comparator 130 may be compensated.

Accordingly, a frequency, that is, a periodic signal of a clock CLK generated by the clock generator 100 in accordance with this embodiment of the disclosure may be ultimately determined by resistance, capacitance, and delay-time elements of the comparator 130.

The clock generator 100 in accordance with this embodiment of the disclosure may be stable during PVT variations, since the frequency of the clock CLK is determined according to sizes of a passive device component R and a capacitor C. In addition, the clock generator 100 in accordance with this embodiment of the disclosure may have improved area efficiency and voltage efficiency, since it does not need to use a high-performance reference voltage generator.

This suggests that a simple voltage generator may be used since the frequency of the clock CLK is independent of a current (refer to Equation 3). As soon as a large current flows in the first constant current source IL a charging rate of the first capacitor $C_1$ may increase. However, at the same time, since the reference voltage $V_R$ is calculated by multiplying the constant current $I_S$ and the resistance R, the reference voltage $V_R$ may increase, too. Accordingly, a crossing point of the first charging voltage $V_{C1}$ and the reference voltage $V_R$ may be always constant.

In addition, since the clock generator 100 in accordance with the embodiment of the disclosure has one comparator 130, power consumption may be small and a mismatch between comparators may not be necessarily considered.

As described above, since the input offset of the comparator 130 is compensated through the process in which a polarity of the input node is changed every period of the clock CLK, the input offset error $e_{off}$ may be removed. Accordingly, transistors configuring the comparator 130 may not need to have larger sizes.

Although an effect of the delay-time component $e_{del}$ of the comparator 130 may exist, the clock generator 100 in accordance with the embodiment of the disclosure may be very stably operated during the PVT variations since the number of variables determining the frequency of the clock CLK is decreased compared to that of a normal clock generator.

Figure 5:
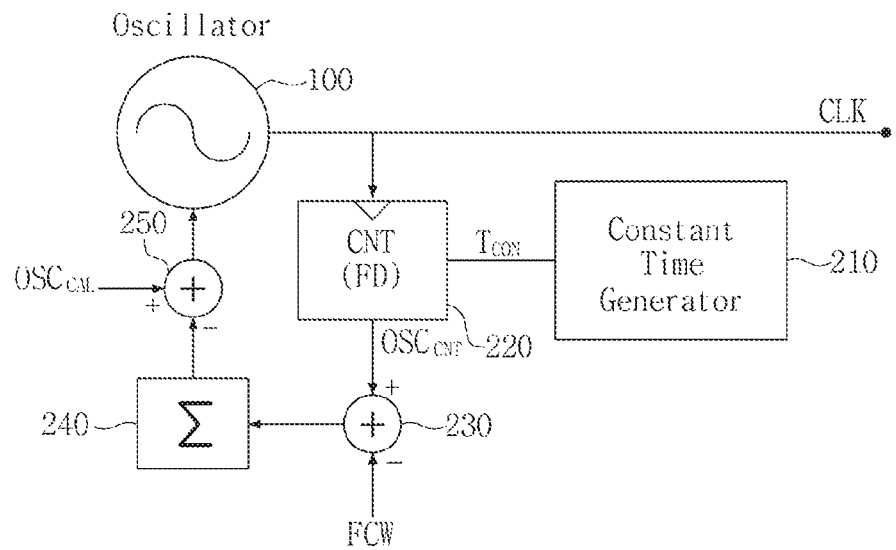
FIG. 5 is a circuit diagram illustrating an on-chip oscillator in accordance with another embodiment of the disclosure.

FIG. 5 is a circuit diagram of an on-chip oscillator 200 in accordance with an embodiment of the disclosure.

Referring to FIG. 5, the on-chip oscillator 200 may include a first periodic signal generator 100, a second periodic signal generator as a constant time generator 210, a counter 220, a comparator 230, an accumulator 240, and a calibrator 250.

The first periodic signal generator 100 may be the clock generator 100 illustrated in FIG. 4A, and include a passive device R. The first periodic signal generator 100 may generate a constant periodic signal since an input node of a comparison circuit therein alternately receives a ramp-up voltage and a constant DC voltage. Since the first periodic signal generator 100, that is, the clock generator 100, has been already described above, detailed descriptions thereof will be omitted.

The second periodic signal generator 210 may always generate a constant periodic signal $T_{CON}$ having a constant period unchanged over time. The second periodic signal generator 210 in accordance with the embodiment of the disclosure may be configured to be insensitive to PVT variations, and thus a signal generated therefrom may be a constant periodic signal unchanged over time. Detailed descriptions thereof will be provided with reference to FIGS. 6A and 6B.

The counter 220 may count an output frequency, that is, the number of clocks CLK, of the first periodic signal generator 100 during the constant periodic signal $T_{CON}$. That is, the counter 220 may count the number of clocks CLK of the first periodic signal generator 100 output for a certain time period and supply an output count signal $OSC_{CNT}$. When the frequency of the clocks CLK varies due to the PVT variations, the output count signal $OSC_{CNT}$ may also vary.

The comparator 230 may compare a frequency signal that is desired by a user, that is, a preset frequency signal FCW with an output count signal $OSC_{CNT}$ which is actually output from the counter 220. That is, the comparator 230 may compare whether the output count signal $OSC_{CNT}$ which is output from the counter 220 is greater than the preset frequency signal FCW or not, and output the result of comparison in the form of a positive or negative sign. For example, when the output count signal $OSC_{CNT}$ is greater than the preset frequency signal FCW, the comparator 230 may detect that the output count signal $OSC_{CNT}$ is increasing, and output −1. When the output count signal $OSC_{CNT}$ is smaller than the preset frequency signal FCW, the comparator 230 may detect that the output count signal $OSC_{CNT}$ is decreasing, and output +1. When the output count signal $OSC_{CNT}$ is the same as the preset frequency signal FCW, the comparator 230 may output 0.

The accumulator 240 may perform summation in response to the results of the comparator 230. That is, the accumulator 240 may accumulate the number of positive and negative values of the comparator 230. That is, the accumulator 240 may perform the summation of the output results of comparator 230 regardless of whether the output results are negative values or positive values.

The calibrator 250 may perform addition or subtraction on the number of clocks of a predetermined-frequency periodic signal of the first periodic signal generator 100 according to the results of the accumulator 240.

Thus, a stable frequency output may be obtained by summing the differences between the output count signal $OSC_{CNT}$ and the preset frequency signal FCW, which is a frequency code signal that is desired by the user, thereby controlling the first periodic signal generator 100. By repeating such processes in a loop, a final target frequency may be obtained according to equation 4.

$$P_{TAR} = \frac{T_{CON}}{FCW} \quad \text{[Equation 4]}$$

(where $P_{TAR}$ represents a final target frequency, $T_{CON}$ represents a constant periodic signal, and FCW represents a preset frequency signal).

The on-chip oscillator 200 in accordance with this embodiment of the disclosure may function similar to a frequency locked loop (FLL) type, and the difference between the actual output count signal $OSC_{CNT}$ and the preset frequency signal FCW may finally converge to zero by repeating the loop. Accordingly, a frequency signal, insensitive to PVT variations and having a constant period, may be output.

Meanwhile, the generation of a periodic signal, which is substantially constant regardless of time, in the second periodic signal generator 210 will be described with reference to the following drawings.

Figure 6A:
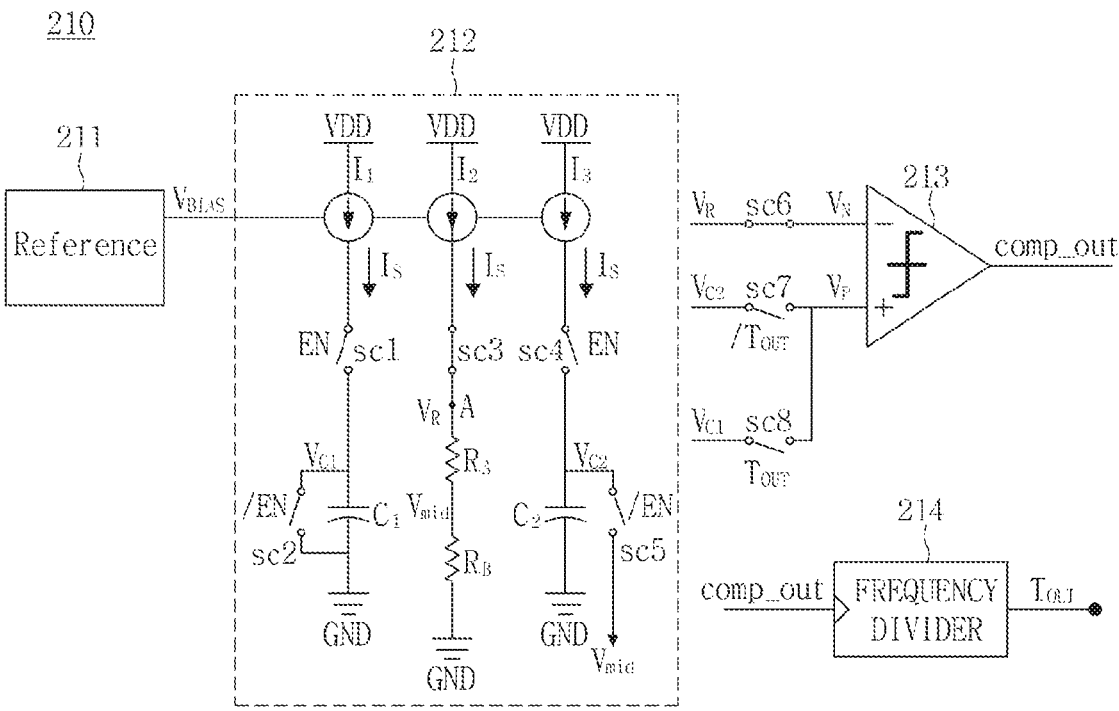
FIG. 6A is a circuit diagram of a second periodic signal generator.

FIG. 6A is a circuit diagram of the second periodic signal generator 210.

Referring to FIG. 6A, the second periodic signal generator 210 may include a bias voltage generator 211, a voltage controller 212, a comparator 213, and a frequency divider 214.

The second periodic signal generator 210 in accordance with the embodiment of the disclosure may generate a time signal that is always constant during PVT variations so that the delay time of the comparator 230 is not affected by the variation in a supply voltage and temperature.

The bias voltage generator 211 may supply a constant bias voltage $V_{BIAS}$.

The voltage controller 212 may include first to third constant current sources I1, I2, and I3, a plurality of switches sc1, sc2, sc3, sc4, and sc5, first and second capacitors C1 and C2, and first and second resistors $R_A$ and $R_B$.

The first constant current source I1 and the first capacitor C1 may be coupled in series through the first switch sc1, and the first capacitor C1 and the first switch sc2 may be coupled in parallel.

The first switch sc1 may be controlled by an enable signal EN. That is, when the enable signal EN is at a high level, a current path from the first constant current source I1 to the first capacitor C1 may be formed to charge the first capacitor C1 with a first charging voltage $V_{C1}$. When the second switch sc2 is coupled with the inverse of the enable signal /EN, a discharging path may be formed from the first capacitor C1, and the first capacitor C1 may be discharged to a ground level.

The third constant current source I3 and the second capacitor C2 may be coupled in series through the fourth switch sc4, and the second capacitor C2 and the fifth switch sc5 may be coupled in parallel.

The fourth switch sc4 is controlled by the enable signal EN. That is, when the enable signal EN is at a high level, a current path from the third constant current source I3 to the second capacitor C2 may be formed, and the second capacitor C2 may be charged with a second charging voltage $V_{C2}$. When the fifth switch sc5 is coupled, a discharging path is formed from the second capacitor C2. Since a voltage of the other node of the fifth switch sc5 is at the middle voltage level $V_{mid}$, the second capacitor C2 may be discharged to the middle voltage level $V_{mid}$.

Meanwhile, the second constant current source I2 disposed between the first constant current source I1 and the third constant current source I3 may be serially coupled to the first and second resistors $R_A$ and $R_B$.

The first and second resistors $R_A$ and $R_B$ may have the same resistance value, but are not limited thereto. Here, since the first and second resistors $R_A$ and $R_B$ exemplarily have the same resistance value, a node between the first and second resistors $R_A$ and $R_B$ may have a half value of a voltage applied across the first and second resistors $R_A$ and $R_B$. This may be defined as the middle voltage $V_{mid}$. A voltage from the second constant current source I2 through the first and second resistors $R_A$ and $R_B$ may be applied to an upper node A of the first and second resistors $R_A$ and $R_B$, herein, the voltage of the node A may be referred to as a reference voltage $V_R$. Accordingly, the middle voltage $V_{mid}$ may be half the reference voltage $V_R$.

One input of the comparator 213 may always receive the reference voltage $V_R$ through switch sc6, and the other input of the comparator 213 may selectively receive the first charging voltage $V_{C1}$ and the second charging voltage $V_{C2}$. The other input of the comparator 213 may be coupled to seventh and eighth switches sc7 and sc8, which may enable the selective input. The seventh switch sc7 may be exemplarily controlled by an inverted level of a final output signal/$T_{OUT}$, and the eighth switch sc8 may be exemplarily controlled by the final output signal $T_{OUT}$, but are not limited thereto. The seventh and eighth switches sc7 and sc8 may be controlled by a separate control signal. The separate control signal may be a signal capable of selectively connecting the switches in response to a predetermined comparison timing signal.

The comparator 213 may compare the reference voltage $V_R$ with the selectively received first charging voltage $V_{C1}$ or second charging voltage $V_{C2}$ and supply a comparison signal comp_out.

The frequency divider 214 may output the final output signal $T_{OUT}$ in response to the comparison signal comp_out input by the comparator 213. The frequency divider 214 may be a half-frequency divider circuit which detects a rising edge of the comparison signal comp_out and may serve to maintain the final output signal $T_{OUT}$ at a high level until the next rising edge.

Figure 6B:
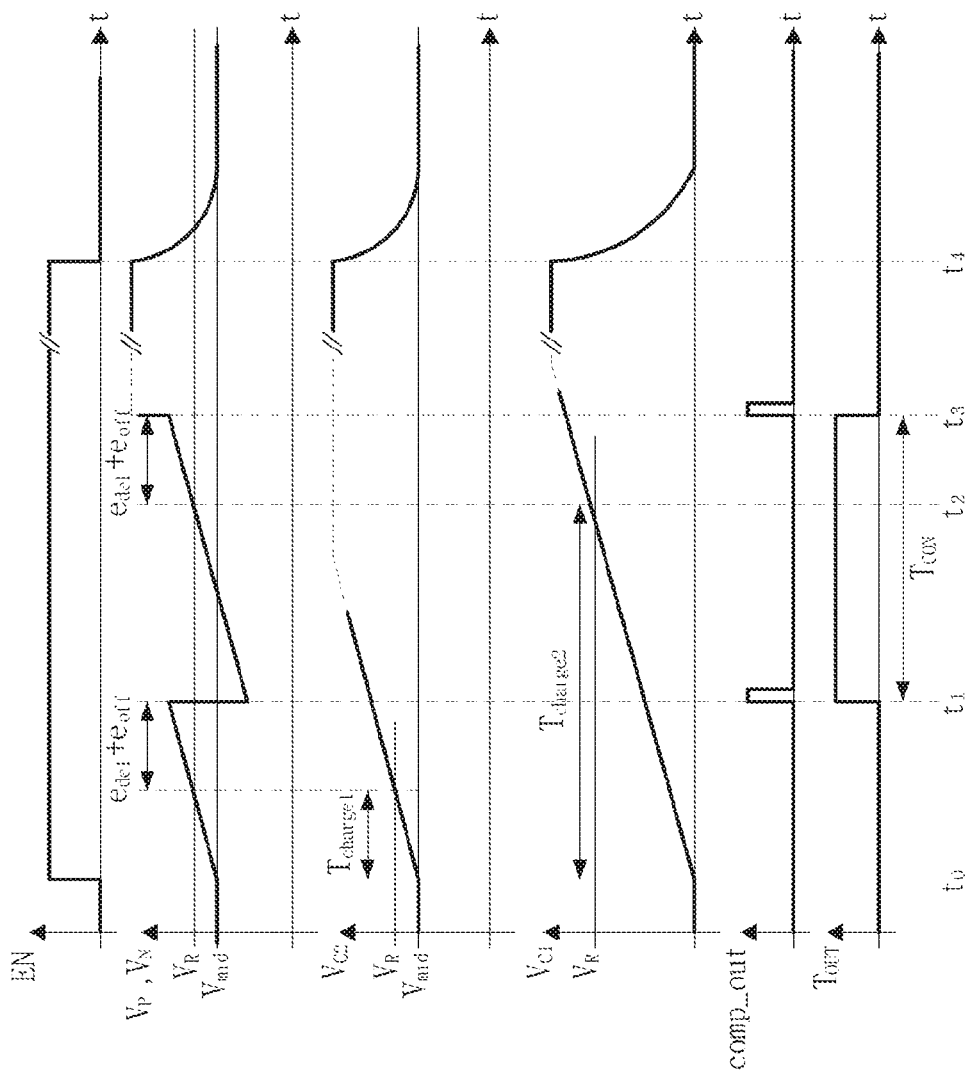
FIG. 6B is an operational timing diagram according to FIG. 6A.

FIG. 6B is an operational timing diagram according to FIG. 6A.

An operation of the second periodic signal generator 210 will be described with reference to FIGS. 6A and 6B.

When the enable signal EN is initially at a low level, the first capacitor C1 may be discharged to the ground level, and the second capacitor C2 may be discharged to the middle voltage $V_{mid}$. Accordingly, the second capacitor C2 may be charged with the middle voltage $V_{mid}$. The comparator 213 may receive the reference voltage $V_R$ through a first input node VN and the middle voltage $V_{mid}$ through a second input node VP. Accordingly, the comparison signal comp_out may be at the low level.

At time t0, when the enable signal EN is activated to the high level, the first capacitor C1 and the second capacitor C2 may be charged by a constant current $I_S$. The second capacitor C2 may be charged faster than the first capacitor C1 to reach the reference voltage $V_R$ faster than the first capacitor C1.

A charging time of the second capacitor C2 may be referred to as a first charging time $T_{charge1}$, and a charging time of the first capacitor C1 may be referred to as a second charging time $T_{charge2}$.

At time t1, the comparator 213 may be toggled to a high level after a predetermined delay time ($e_{del}+e_{off}$) has elapsed from the first charging time $T_{charge1}$, and then transitioned to a low level.

When the eighth switch sc8 is coupled in response thereto, the first charging voltage $V_{C1}$ is input to the second input node VP of the comparator 213. The comparator 213 may compare the first charging voltage $V_{C1}$ with the reference voltage $V_R$ while tracking the first charging voltage $V_{C1}$ from the time t1.

Then, when the first charging voltage $V_{C1}$ becomes greater than the reference voltage $V_R$ at time t2, that is, when the first charging voltage $V_{C1}$ is charged to the reference voltage $V_R$, the comparator 213 may be toggled to a high level and transitioned to a low level at time t3 after the predetermined delay time ($e_{del}+e_{off}$) has elapsed.

Meanwhile, the frequency divider 214 may detect a rising edge of the comparison signal comp_out and output the final output signal $T_{OUT}$ maintained at this level until the next rising edge.

In the second periodic signal generator 210 in accordance with the embodiment of the disclosure, the time period t1 to t3, that is, a time interval between output points of the comparator 213 may be defined as a constant periodic signal $T_{CON}$.

That is, according to the embodiment of the disclosure, the comparator 213 may be controlled to output an output result twice while the enable signal EN is activated once and the difference between the two output results may be defined as the constant periodic signal $T_{CON}$.

More specifically, the time at which the first comparison signal comp_out is output may be the time including the delay time component ($e_{del}+e_{off}$) of the comparator 213.

Likewise, the time at which the second comparison signal comp_out is output may be the time including the delay time component ($e_{del}+e_{off}$) of the comparator 213, too.

That is, since one comparator 213 is used, the delay time component ($e_{del}+e_{off}$) of the comparator 213 may be the same, and the time interval between the output points of the comparator 213 may be a condition to compensate for the delay time component ($e_{del}+e_{off}$).

Assuming that the first capacitor C1 and the second capacitor C2 have a capacitance value $C_0$ (that is, $C_1=C_2=C_0$), the difference between the time in which a predetermined comparison delay time ($e_{del}+e_{off}$) is added to a time for charging the first capacitor C1 from the ground level to the reference voltage $V_R$, and the time in which the predetermined comparison delay time ($e_{del}+e_{off}$) is added to a time for charging the second capacitor C2 from the middle voltage $V_{mid}$ to the reference voltage $V_R$, may be expressed as Equation 5.

$$T_{CON} = \left(\frac{C_0 V_R}{I_S} + e_{del} + e_{off}\right) - \left(\frac{C_0(V_R - V_{mid})}{I_S} + e_{del} + e_{off}\right) \quad \text{[Equation 5]}$$
$$= \frac{C_0 V_{mid}}{I_S} = R_B C_0$$

(where, assuming that $R_A$ and $R_B$ are the same value, $R_B$ may be marked as $R_A$).

According to Equation 5, the delay time component ($e_{del}+e_{off}$) may be completely removed since it serves as a common mode component. Thus, the constant periodic signal $T_{CON}$ may be determined only by the resistance and the capacitance.

It is obvious to those skilled in the art that when a capacitor is formed to have a metal-insulator-metal (MIM) structure or a vertical native (VN) structure, the capacitor may be stable without being varied according to supply voltage or temperature variations.

In addition, B. Robert Gregoire, et al. ("Process-Independent Resistor Temperature-Coefficients using Series/Parallel and Parallel/Series Composite Resistors," IEEE International Symposium on Circuits and Systems (ISCAS), 2007, pp 2826-2829) have already shown that when a resistor is formed with combination of resistors having temperature coefficients of opposite signs in consideration of a temperature coefficient of a resistor (TCR), the resistor may be stable during supply voltage or temperature variations.

Thus, according to the embodiments of the disclosure, an on-chip oscillator stable during PVT variations and operated with low power may be implemented.

The on-chip oscillator according to the embodiments of the disclosure may implement a frequency locked loop (FLL) which excludes an external clock source and performs self-error compensation.

That is, the on-chip oscillator according to the embodiments of the disclosure may generate a constant periodic signal over time and, by using the constant periodic signal as a reference signal for comparing a preset frequency and an actual output frequency, may continuously operate loops until there is no difference between the two frequencies. Accordingly, the on-chip oscillator according to the embodiments of the disclosure may not only self-compensate a frequency without any external clock source, but may also generate a constant frequency during the PVT variations.

Thus, the on-chip oscillator according to the embodiments of the disclosure may be operated with low power, and generate a clock signal having a constant period. In addition, the on-chip oscillator according to the embodiments of the disclosure may be stably operated during PVT variations and have high area efficiency.

Figure 7:
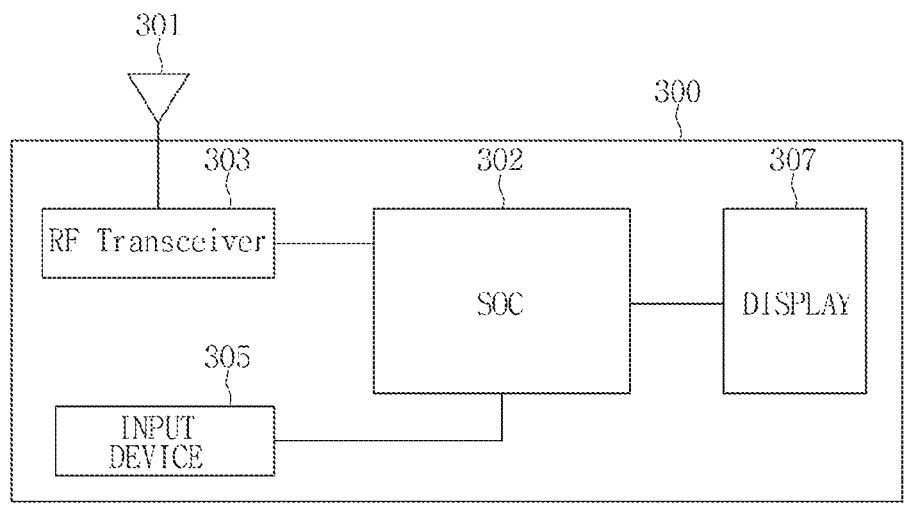
FIG. 7 illustrates an exemplary embodiment of a semiconductor system including the on-chip oscillator illustrated in FIG. 5.

FIG. 7 illustrates an exemplary embodiment of a semiconductor system including the on-chip oscillator 200 illustrated in FIG. 5.

Referring to FIG. 7, a semiconductor system 300 may include an SoC 302 including the on-chip oscillator 200 illustrated in FIG. 5, an antenna 301, an RF transceiver 303, an input device 305, and a display 307. The RF transceiver 303 may transmit and receive an RF signal through the antenna 301. For example, the RF transceiver 303 may modify the RF signal received through the antenna 301 into a signal that can be processed in the SoC 302.

Accordingly, the SoC 302 may process the signal output from the RF transceiver 303 and transmit the processed signal to the display 307. In addition, the RF transceiver 303 may modify the signal output from the SoC 302 to an RF signal and output the modified RF signal to an external device through the antenna 301.

The input device 305 may be a device configured to input a control signal for controlling an operation of the SoC 302 or data to be processed by the SoC 302, and may be implemented as a pointing device, such as a touch pad or a computer mouse, a keypad, or a keyboard.

Figure 8:
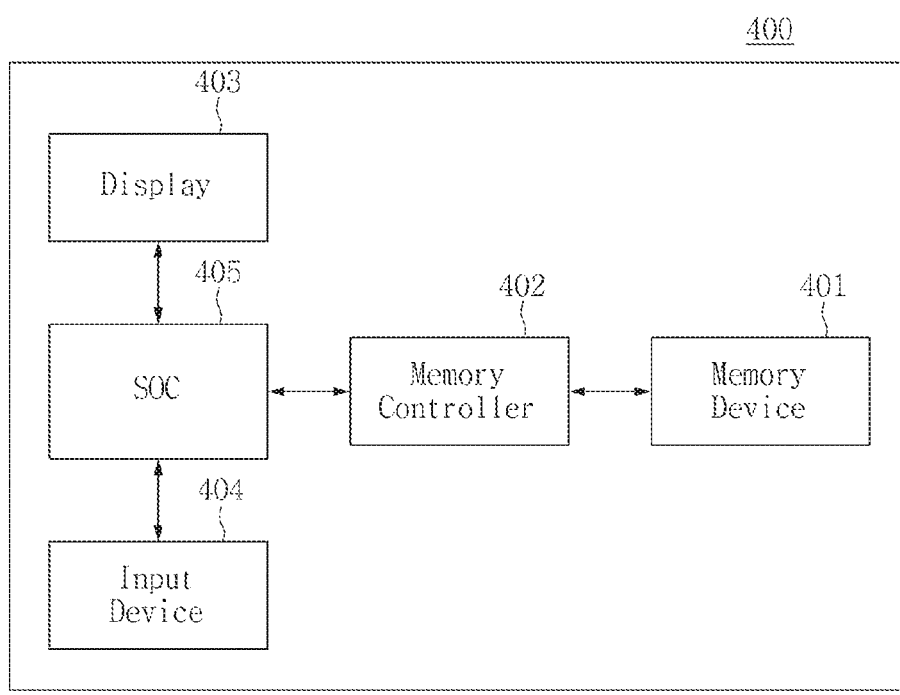
FIG. 8 illustrates an exemplary embodiment of a computer system including the on-chip oscillator illustrated in FIG. 5.

FIG. 8 illustrates an exemplary embodiment of a computer system including the on-chip oscillator 200 illustrated in FIG. 5. Referring to FIG. 8, a computer system 400 including the on-chip oscillator 200 illustrated in FIG. 5 may be implemented as a personal computer (PC), a network server, a tablet PC, a net-book, an e-reader, a personal digital assistant (PDA), a portable multimedia player (PMP), an MP3 player, or an MP4 player.

The computer system 400 may include an SoC 405, a memory device 401, a memory controller 402 for controlling data processing operations of the memory device 401, a display 403, and an input device 404.

The SoC 405 may display data, stored in the memory device 401 according to data input through the input device 404, through the display 403. For example, the input device 404 may be implemented as a pointing device, such as a touch pad or a computer mouse, a keypad, or a keyboard. The SoC 405 may control overall operations of the computer system 400 and control an operation of the memory controller 402.

The memory controller 402 for controlling the operation of the memory device 401 in accordance with the embodiments of the disclosure may be implemented as a part of the SoC 405 or a chip separated from the SoC 405.

Figure 9:
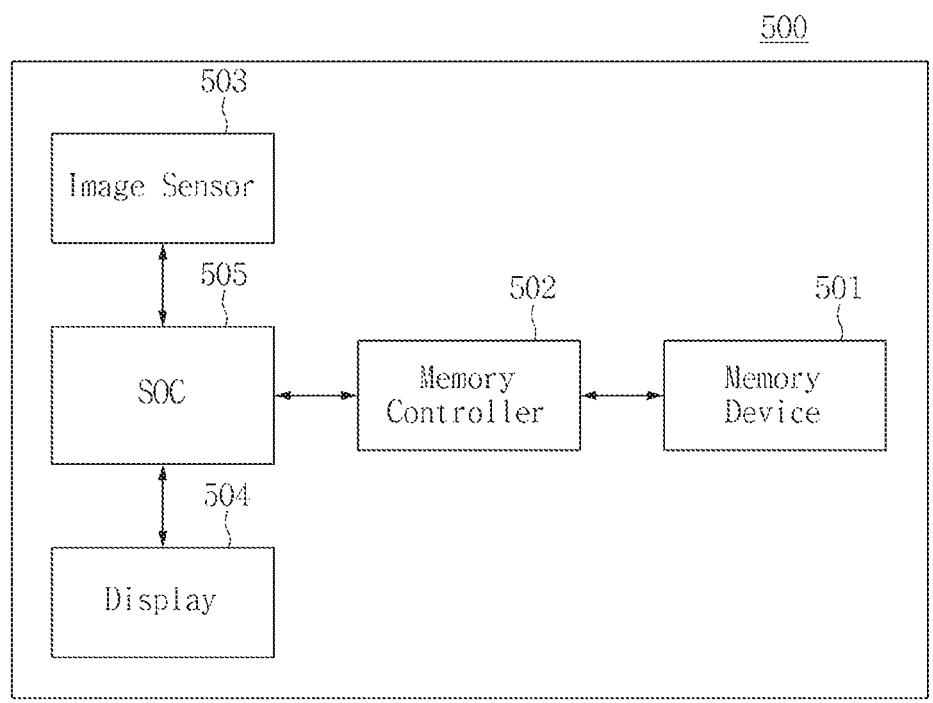
FIG. 9 illustrates another exemplary embodiment of a computer system including the on-chip oscillator illustrated in FIG. 5.

FIG. 9 illustrates another exemplary embodiment of a computer system including the on-chip oscillator 200 illustrated in FIG. 5. Referring to FIG. 9, a computer system 500 including the on-chip oscillator 200 illustrated in FIG. 5 may be implemented as an image processing device, such as a digital camera, or a mobile phone or smart phone in which the digital camera is embedded.

The computer system 500 may include an SoC 505, a memory device 501, and a memory controller 502 for controlling data processing operations, such as read operations or write operations, of the memory device 501. In addition, the computer system 500 may further include an image sensor 503 and a display 504.

The image sensor 503 of the computer system 500 may convert an optical image to digital signals, and transfer the converted digital signals to the SoC 505 or the memory controller 502. According to the control of the SoC 505, the converted digital signals may be displayed on the display 504 or stored in the memory device 501 through the memory controller 502. In addition, data stored in the memory device 501 may be displayed on the display 504 according to the control of the SoC 505 or the memory controller 502. The memory controller 502 for controlling the operation of the memory device 501 may be implemented as a part of the SoC 505 or a chip separated from the SoC 505.

Figure 10:
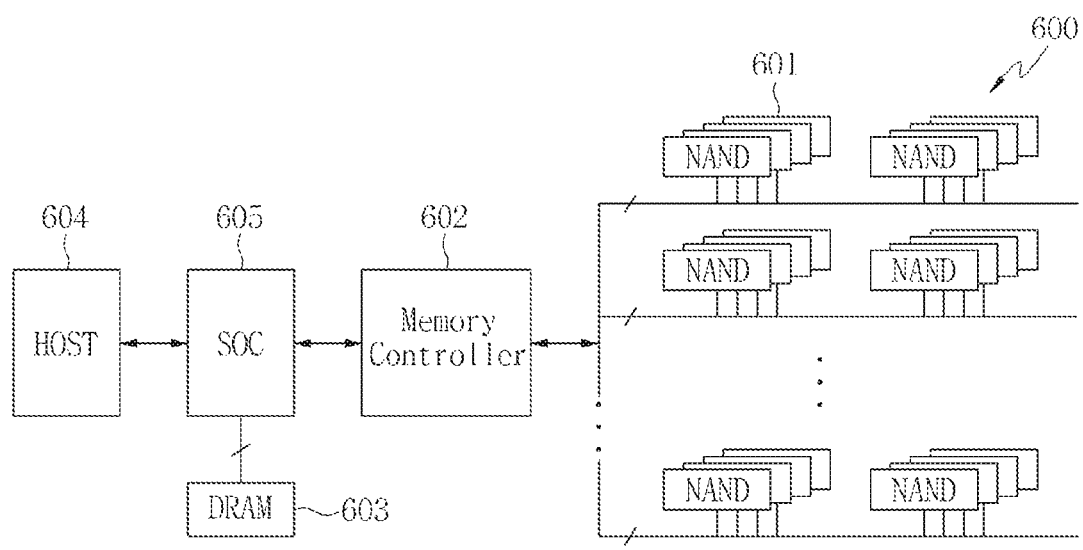
FIG. 10 illustrates an exemplary embodiment of a memory system including the on-chip oscillator illustrated in FIG. 5.

FIG. 10 illustrates an exemplary embodiment of a memory system including the on-chip oscillator 200 illustrated in FIG. 5. Referring to FIG. 10, the memory system 600 may be implemented as a data processing apparatus, such as a solid state drive (SSD).

The memory system 600 may include a plurality of memory devices 601, a memory controller 602 for controlling data processing operations of each memory device 601, a volatile memory device 603 such as a DRAM, and an SoC 605 for controlling storing of data transferred between the memory controller 602 and a host 604 in the volatile memory device 603.

The embodiments of the disclosure may be implemented as codes readable by a computer in a computer-readable recording medium.

The computer-readable recording medium may refer to all types of recording devices in which data readable by a computer system is stored. Examples of the computer-readable recording medium may be a ROM, a RAM, a CD-ROM, a magnetic tape, a floppy disk, an optical data storage apparatus, and the like. In addition, the computer-readable recording medium may be distributed in a networked computer system, and the codes readable by computer may be stored and executed in a distribution method. In addition, functional programs, codes, and code segments for implementing the embodiments of the disclosure may be easily inferred by programmers skilled in the art.

As set forth above, the clock generator in accordance with the embodiments of the disclosure can reduce input offset errors and stably operate during PVT variations through one comparator configured to compare a constant voltage, obtained by a passive device, with a linearly increasing voltage.

Although a few embodiments have been described, those skilled in the art will readily appreciate that many modifications are possible without materially departing from the novel teachings and advantages. Accordingly, all such modifications are intended to be included within the scope of this disclosure as defined in the claims.

What is claimed is:

1. A clock generator comprising:
a comparator having first and second input terminals respectively configured to receive first and second input signals; and
a voltage controller including a resistor and at least one constant current source, wherein:
the voltage controller generates a direct current (DC) voltage proportional to an output current of the constant current source and a resistance value of the resistor, and
the comparator compares a ramp voltage generated by the voltage controller with the DC voltage and in response thereto outputs a clock signal having a clock period,
wherein the first input signal at the first input terminal comprises the ramp voltage during a first portion of the clock period and comprises the DC voltage during a second portion of the clock period, and the second input signal at the second input terminal comprises the DC voltage during the first portion of the clock period and comprises the ramp voltage during the second portion of the clock period.

2. The clock generator of claim 1, wherein:
the voltage controller includes a first capacitor and a second capacitor, and
the resistor is coupled between the first at least one current source and ground.

3. The clock generator of claim 2, wherein the second capacitor is discharged while the first capacitor is charged, and the second capacitor is charged while the first capacitor is discharged.

4. The clock generator of claim 3, wherein the ramp voltage comprises a voltage charged in the first capacitor and a voltage charged in the second capacitor.

5. The clock generator of claim 4, wherein input nodes of the comparator alternately receive the DC voltage and the voltages charged in the first capacitor and the second capacitor over time.

6. A clock generator comprising:
a voltage generator configured to supply a bias voltage;
a voltage controller including a constant current source, a resistor, and a capacitance and configured to generate a ramp voltage between the constant current source and the capacitance and generate a direct current (DC) voltage between the constant current source and the resistor based upon the bias voltage; and
a comparator having first and second input terminals configured to generate a clock signal by comparing the ramp voltage with the DC voltage,
wherein a first input signal at the first input terminal comprises the ramp voltage during a first portion of the clock period and comprises the DC voltage during a second portion of the clock period, and a second input signal at the second input terminal comprises the DC voltage during the first portion of the clock period and comprises the ramp voltage during the second portion of the clock period.

7. The clock generator of claim 6, wherein the voltage generator includes a metal-oxide semiconductor field-effect-transistor (MOSFET).

8. The clock generator of claim 7, wherein the voltage generator comprises:
a plurality of switches controlled by the clock signal;
a first capacitor and a second capacitor, each having the capacitance, which are charged and discharged opposite to each other according to settings of some of the switches; and
a resistor coupled between the constant current source and ground.

9. The clock generator of claim 8, wherein the voltage controller forms a current path from the constant current source to the resistor according to the clock signal to generate the DC voltage.

10. The clock generator of claim 8, wherein the second capacitor is discharged while the first capacitor is charged, according to the clock signal.

11. The clock generator of claim 10, wherein the comparator compares the DC voltage with the ramp voltage charged in the first capacitor.

12. The clock generator of claim 8, wherein the second capacitor is charged while the first capacitor is discharged, according to the clock signal.

13. The clock generator of claim 12, wherein the comparator compares the DC voltage with the ramp voltage charged in the second capacitor.

14. The clock generator of claim 8, wherein capacitances of the first capacitor and the second capacitor are substantially the same as each other.

15. The clock generator of claim 6, wherein input nodes of the comparator alternately receive the DC voltage and the ramp voltage over time.

16. A clock generator comprising:
a first voltage source that: (1) generates a first ramp voltage, during a first portion of a clock cycle, by conveying an amount of current through a first capacitor, and (2) generates a constant voltage during a second portion of the clock cycle by conveying the amount of current through a resistance;
a second voltage source that: (1) generates the constant voltage during the first portion of the clock cycle by conveying the amount of current through the resistance, and (2) generates a second ramp voltage, during the second portion of the clock cycle, by conveying the amount of current through a second capacitor; and
a comparator that generates a clock signal having the clock cycle by:
(1) comparing the first ramp voltage generated by the first voltage source to the constant voltage generated by the second voltage source during the first portion of the clock cycle, and
(2) comparing the constant voltage generated by the first voltage source to the second ramp voltage generated by the second voltage source during the second portion of the clock cycle,
wherein the first and second portions of the clock cycle are non-overlapping periods.

17. The clock generator of claim 16, further comprising:
first and second current sources that each generates a constant current of the amount of current; and
first, second, third, and fourth switches,
wherein:
the first switch provides a first current path between the first current source and the first capacitor during the first portion of the clock cycle and does not provide the first current path between the first current source and the first capacitor during the second portion of the clock cycle,
the second switch provides a second current path between the first current source and the resistance during the second portion of the clock cycle and does not provide the second current path between the first current source and the resistance during the first portion of the clock cycle, the third switch provides a third current path between the second current source and the resistance during the first portion of the clock cycle and does not provide the third current path between the second current source and the resistance during the second portion of the clock cycle, and the fourth switch provides a fourth current path between the second current source and the second capacitor during the second portion of the clock cycle and does not provide the fourth current path between the second current source and the second capacitor during the first portion of the clock cycle.

18. The clock generator of claim 17, further comprising fifth and sixth switches, wherein the fifth switch is connected directly across the first capacitor and the sixth switch is connected directly across the second capacitor, wherein the fifth switch is open during the first portion of the clock cycle, and closed during the second portion of the clock cycle to discharge a voltage on the first capacitor during the second portion of the clock cycle, and wherein the sixth switch is closed during the first portion of the clock cycle to discharge a voltage on the second capacitor during the first portion of the clock cycle, and open during the second portion of the clock cycle.

19. The clock generator of claim 16, wherein the comparator has a first input which receives the first ramp voltage generated by the first voltage source during the first portion of the clock cycle and receives the constant voltage generated by the first voltage source during the second portion of the clock cycle, and wherein the comparator has a second input which receives the constant voltage generated by the second voltage source during the first portion of the clock cycle and receives the second ramp voltage generated by the second voltage source during the second portion of the clock cycle.

20. The clock generator of claim 16, wherein a capacitance value of the first capacitor is equal to a capacitance value of the second capacitor, and wherein a period of the clock cycle depends only on the capacitance value of the first capacitor, a resistance value of the resistor, and a delay time of the comparator.

* * * * *